United States Patent
Hirama

[11] Patent Number: 6,111,341
[45] Date of Patent: Aug. 29, 2000

[54] PIEZOELECTRIC VIBRATOR AND METHOD FOR MANUFACTURING THE SAME

[75] Inventor: Kouichi Hirama, Kouza-gun, Japan

[73] Assignee: Toyo Communication Equipment Co., Ltd., Kanagawa, Japan

[21] Appl. No.: 09/171,698
[22] PCT Filed: Oct. 22, 1997
[86] PCT No.: PCT/JP97/03807
§ 371 Date: Dec. 21, 1998
§ 102(e) Date: Dec. 21, 1998
[87] PCT Pub. No.: WO98/38736
PCT Pub. Date: Sep. 3, 1998

[30] Foreign Application Priority Data

Feb. 26, 1997 [JP] Japan .................................. 9-058288

[51] Int. Cl.$^7$ .................................................. H01L 41/08
[52] U.S. Cl. .................... 310/365; 310/312; 310/320; 310/369
[58] Field of Search ............................ 310/320, 365, 310/366, 369, 312

[56] References Cited

U.S. PATENT DOCUMENTS

| | | | |
|---|---|---|---|
| 3,781,577 | 12/1973 | Nonaka et al. | 310/365 |
| 4,443,733 | 4/1984 | Samodovitz | 310/365 X |
| 4,910,838 | 3/1990 | Jensen et al. | 310/312 X |

FOREIGN PATENT DOCUMENTS

| | | | |
|---|---|---|---|
| 1198866 | 8/1965 | Germany | 310/369 |
| S50-159989 | 12/1975 | Japan . | |
| 0060089 | 5/1977 | Japan | 310/369 |
| S56-10727 | 2/1981 | Japan . | |
| S57-148916 | 9/1982 | Japan . | |
| S62-168409 | 7/1987 | Japan . | |
| H2-260910 | 10/1990 | Japan . | |
| H3-1710 | 1/1991 | Japan . | |
| H4-196912 | 7/1992 | Japan . | |

*Primary Examiner*—Mark O. Budd
*Attorney, Agent, or Firm*—Koda & Androlia

[57] ABSTRACT

In a piezoelectric vibrator which has excitation electrodes respectively disposed on the top surface and undersurface of a piezoelectric substrate, at least one of the excitation electrodes being an inverted-mesa electrode that has a recess formed in the opposite side of the electrode from the side which contacts the piezoelectric substrate. Thus, an AT-cut quartz resonator in which the capacitance ratio γ is reduced to a value below the limit value can be provided as a result of use of the inverted-mesa electrodes as excitation electrodes.

10 Claims, 10 Drawing Sheets

Fig. 8
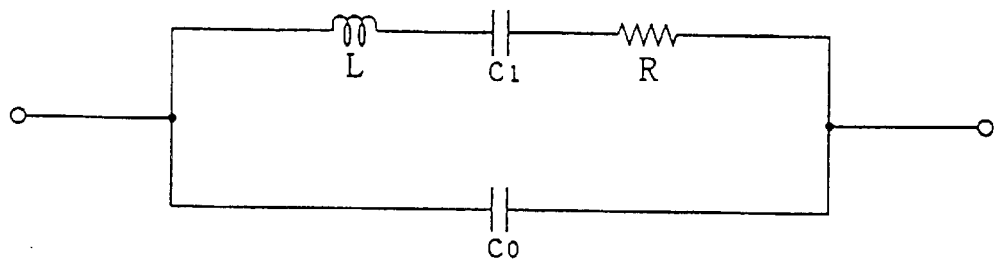
Fig. 9
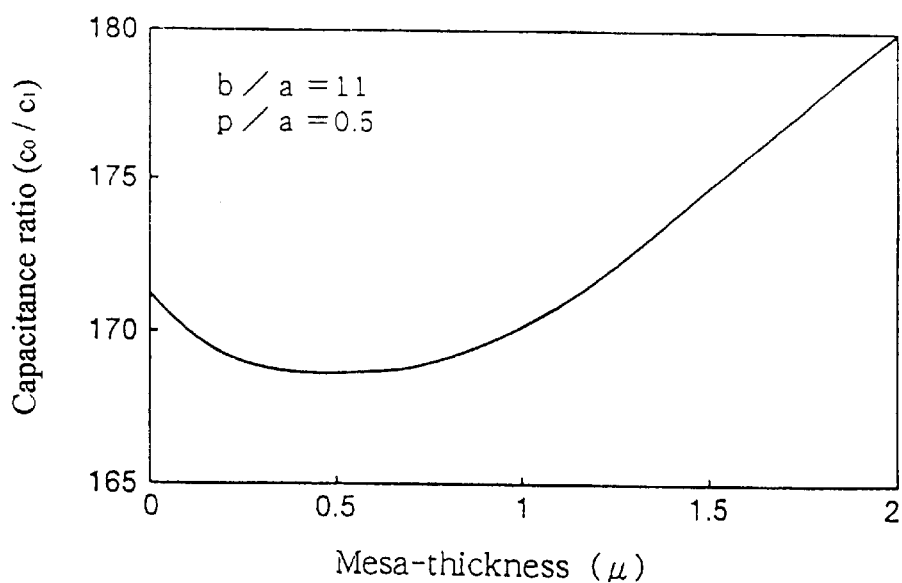
Fig. 10
| Items | Adapted value |
|---|---|
| Elastic Constant | $29.48 \times 10^9$ N/m$^2$ |
| Piezoelectric Constant | $2.418 \times 10^9$ N/C |
| Dielectric Constant | $2.480 \times 10^{10}$ m/F |
| Density | $2.650 \times 10^3$ kg/m$^3$ |

PIEZOELECTRIC VIBRATOR AND METHOD FOR MANUFACTURING THE SAME

BACKGROUND OF THE INVENTION

1. Field of the Invention

The present invention relates to a piezoelectric vibrator which is used in, for instance, frequency voltage-controlled oscillators (VCOs) and more particularly to an AT-cut quartz resonators in which the capacitance ratio γ is reduced by the use of an inverted-mesa electrode.

2. Description of Prior Art

Generally, quartz crystal resonators have a high Q value, so that the frequency stability of such resonator is high. The resonators are widely used in radio apparatus as reference oscillators, etc. AT-cut quartz resonators are particularly superior in terms of temperature-frequency characteristics.

As shown in FIG. 22, in a conventional an AT-cut quartz resonator, disk-form electrodes 3a and 3b, which are smaller than the diameter of a circular AT-cut quartz crystal substrate 1, are provided on both sides of the central portion 2 of the substrate 1, and lead wires for supplying voltage are led out from these electrodes 3a and 3b. Here, a parallel-plane substrate or a substrate which has been subjected to bevel working, etc. is used for the substrate 1; and gold, silver, aluminum, nickel or alloys of these metals, etc. are used as the electrodes 3a and 3b.

The AT-cut quartz resonator described above is generally used in a frequency voltage-controlled oscillator (VCO) in which the oscillation frequency is controlled by a voltage from the outside, thus constituting a frequency voltage-controlled quartz crystal oscillator (VCXO). The AT-cut quartz resonators used in such applications should therefore offer not only a broad adjustable range of frequencies but also an excellent frequency stability when the control voltage is constant.

However, the VCXO that uses quartz resonators has problems: although the frequency stability is high due to the fact that the Q value is higher than that of other piezoelectric vibrators, the frequency adjustable range is narrow, thus making it difficult to satisfy the above-described requirements.

The AT-cut quartz resonators, that is, vibrators formed by providing electrodes of a uniform thickness to an AT-cut quartz substrate which has a parallel plane shape or which has been subjected to bevel working (as shown in FIG. 22) are used in such VCXOs, the frequency adjustable range is narrow since the characteristics capacitance ratio γ of the AT-cut quartz resonator has a minimum limit value of approximately 200 and cannot be lowered any further than such a value.

When the capacitance ratio γ of such an AT-cut quartz resonator is reduced, there are such merits as the short-term stability is improved, the frequency adjustable range is broadened when a filter construction is employed, impedance can be lowered and excitation is facilitated in addition that the frequency adjustable ranges of the VCO is broadened. Nevertheless, it has been considered impossible in the past to lower the capacitance ratio γ of the AT-cut quartz crystal as oscillator described above to a value of 200 or lower.

The present invention is devised in light of the above facts; and the object of the present invention is to provide an AT-cut quartz resonator which makes it possible to reduce the capacitance ratio γ to a value smaller than the conventional characteristic capacitance ratio γ, that has been recognized by a person skilled in the art, by using inverted-mesa electrodes.

DISCLOSURE OF THE INVENTION

In order to accomplish the object, the present invention is characterized in that in a piezoelectric vibrator, in which excitation electrodes are respectively disposed on the top surface and undersurface of a piezoelectric substrate, at least one of the excitation electrodes is an inverted-mesa electrode which has a recess formed in the opposite side of the electrode from the side that contacts the piezoelectric substrate.

Another characteristic feature of the present invention is that the ratio of mesa thickness and ratio of mesa length of the inverted-mesa electrode are set so that the capacitance ratio of the piezoelectric vibrator is less than 200.

Another characteristic feature of the present invention is that the piezoelectric substrate is an AT-cut quartz crystal substrate.

Another characteristic feature of the present invention is that the portion of the piezoelectric substrate that corresponds to a peripheral portion of the electrode located in the central portion of at least one of the two sides of the piezoelectric substrate is formed with a greater thickness than other portions of the substrate, and an excitation electrode that has a uniform thickness is disposed on this central-portion, thus forming the inverted-mesa electrode.

Another characteristic feature of the present invention is that the recess of the inverted-mesa electrode is formed in the shape of a stairway.

Another characteristic feature of the present invention is that the recess of the inverted-mesa electrode is curved in a concave shape.

Another characteristic feature of the present invention is that the recess of the inverted-mesa electrode is curved in a convex shape.

Still another characteristic feature of the present invention is that in a method for manufacturing an AT-cut quartz resonator in which excitation electrodes are respectively disposed on the top surface and undersurface of a piezoelectric substrate, the method comprises a step in which a piezoelectric substrate is prepared, a step in which plate-form excitation electrodes are provided to both sides of the piezoelectric substrate, and a step in which the central portion of the surface of at least one of the excitation electrodes, which is on the opposite side of the electrode from the side in contact with the piezoelectric substrate, is removed so as to form a recess.

Another characteristic feature of the present invention is that in a method for manufacturing an AT-cut quartz resonator in which excitation electrodes are respectively disposed on the top surface and undersurface of a piezoelectric substrate, the method comprises a step in which a piezoelectric substrate which is somewhat thick is prepared, a step in which a part of the piezoelectric substrate is removed from the central portion of the surface on at least one of the two sides of the piezoelectric substrate so that the portion of the substrate corresponding to the peripheral portion of the inverted-mesa electrode becomes thicker than the other portions of the substrate, and a step in which an excitation electrode with a uniform thickness is disposed on the central portion of the piezoelectric substrate so as to form an inverted-mesa electrode.

BRIEF DESCRIPTION OF THE DRAWINGS

FIG. 1 illustrates the constitution of one embodiment of the AT-cut quartz resonator according to the present invention wherein

FIG. 8 is a diagram which shows the equivalent circuit of the quartz resonator.

FIG. 9 is a graph which shows the relationship between the ratio of mesa thickness $\mu$ and the capacitance ratio $\gamma$ in the model shown in FIG. 2.

FIG. 10 shows the material constants of the AT-cut quartz resonator.

PREFERRED EMBODIMENTS OF THE INVENTION

Figure 1A:
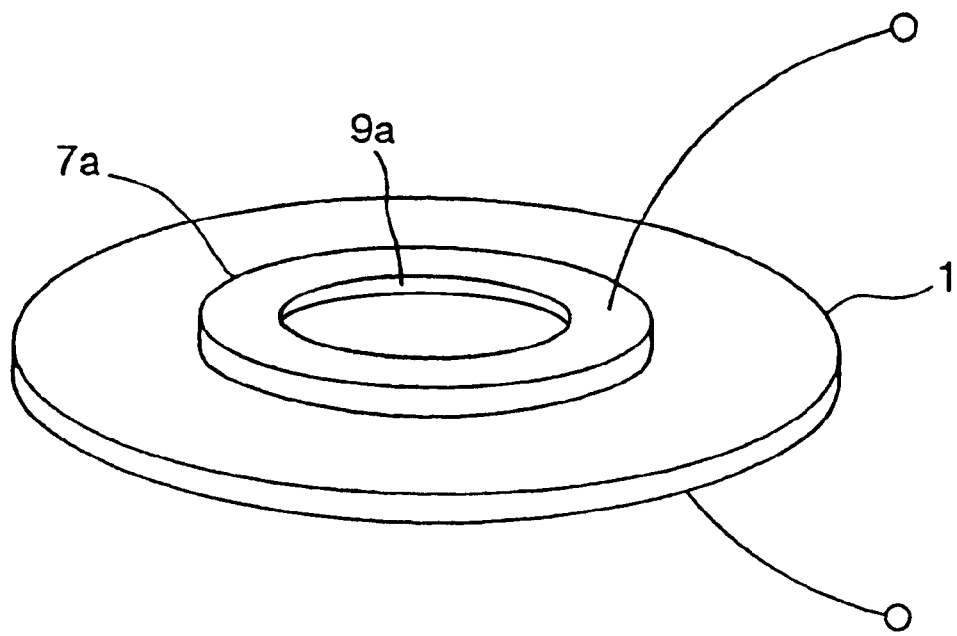
FIG. 1(a) is a perspective view thereof.

Below, the present invention will be described based upon the embodiments illustrated in the drawings. FIG. 1 illustrates the structure of one embodiment of the AT-cut quartz resonator according to the present invention wherein FIG. 1 (a) is a perspective view and FIG. 1(b) is a sectional view taken along the centerline of the quartz crystal substrate shown in FIG. 1(a).

Figure 1B:
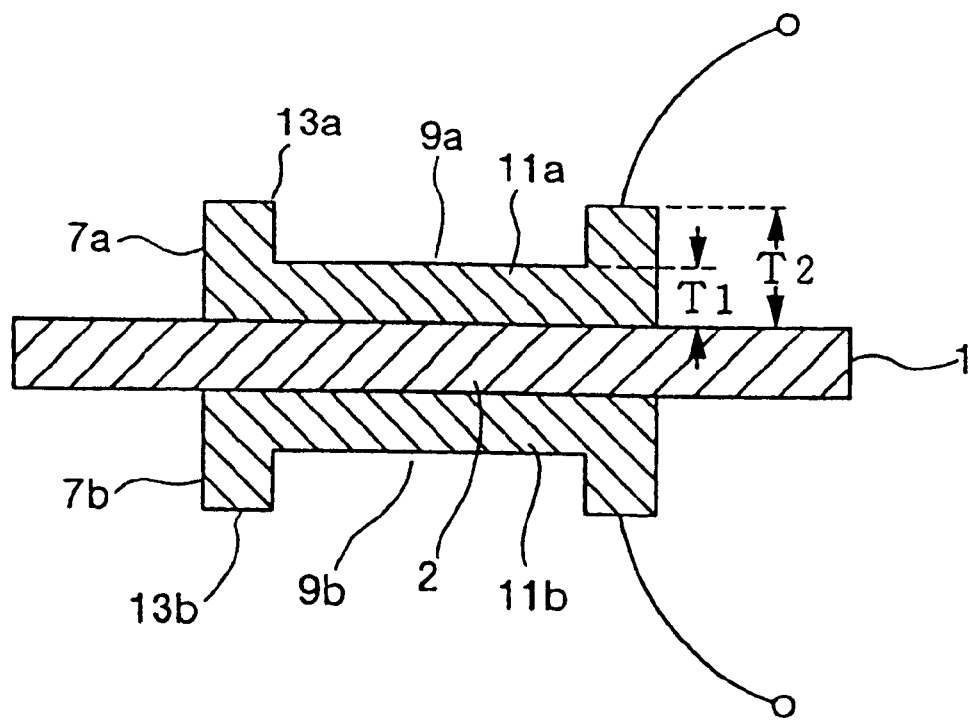
FIG. 1(b) is a cross sectional view taken along the center line of the quartz crystal substrate shown in FIG. 1(a).

As shown in FIG. 1, in this AT-cut quartz resonator, excitation electrodes 7a and 7b which are smaller in diameter than a circular parallel flat-plate type AT-cut quartz substrate 1 are disposed on both sides of roughly the central portion 2 of the AT-cut quartz substrate. As shown in FIG. 1(b), the excitation electrodes 7a and 7b are formed an inverted-mesa shape respectively in which the sides that contact the quartz crystal substrate have a flat planar shape and adheres closely to the quartz crystal substrate 1. In addition, recesses 9a and 9b are formed in the central portions of the surfaces on the opposite sides from the sides that contact the quartz crystal substrate. More specifically, as shown in FIG. 1(b), the thickness T1 of the central portions 11a and 11b of the electrodes 7a and 7b is smaller by a prescribed amount than the thickness T2 of the peripheral portions 13a and 13b that surround the central portions 11a and 11b.

The feature of the present invention is that by forming the excitation electrodes into inverted-mesa electrodes as described in the embodiment above, the characteristic capacitance ratio $\gamma$ is reduced to a value lower than the limit value (approximately 200), which is conventionally recognized by persons skilled in the art as the value of quartz resonators that is formed by electrodes of a uniform thickness on an AT-cut quartz crystal substrate that has a parallel plane shape or upon which a bevel working has been performed.

In other words, the capacitance ratio $\gamma$ can be reduced by forming electrodes so as to have an inverted-mesa structure and not a uniform thickness structure which was previously thought to be appropriate. Accordingly, the relationship between the inverted-mesa shape of the excitation electrodes and the capacitance ratio $\gamma$ of the quartz resonator that has such excitation electrodes was examined using energy trapping analysis procedure of an isotropic plate, and the results obtained will be described below in detail.

The energy trapping displacement and distribution of AT-cut quartz resonator having a conventional electrode structure shows a partial cosine shape in the electrode portions and an exponential shape which continuously connects the displacement and force, in the peripheral portions. A displacement shape was examined for the structure in which the electrode portions are of an inverted-mesa double electrode structure. As a result, it was found that by varying the mesa shape, the displacement shape solution consisting of "central portion flatness" exists in a state in which no inharmonic spurious S1 mode is generated.

It was further found that when the capacitance ratio is observed while varying the mesa shape in this state, the capacitance ratio reaches a minimum value in the vicinity of this "central portion flatness" displacement shape. Moreover, the calculated value of this minimum value was 169.

Next, the analysis model used for analyzing the displacement distribution of the inverted-mesa shape will be described:

The X-direction anisotropy of an AT-cut quartz resonator with respect to the plate thickness and the Z-direction anisotropy of the oscillator with respect to the plate thickness are substituted for isotropic analyses by the multiplication of correction coefficients. Accordingly, an analysis model that comprises an isotropic substrate 19 which has inverted-mesa electrodes 17a and 17b and has the cross section as shown in FIG. 2 is envisioned.

Figure 2:
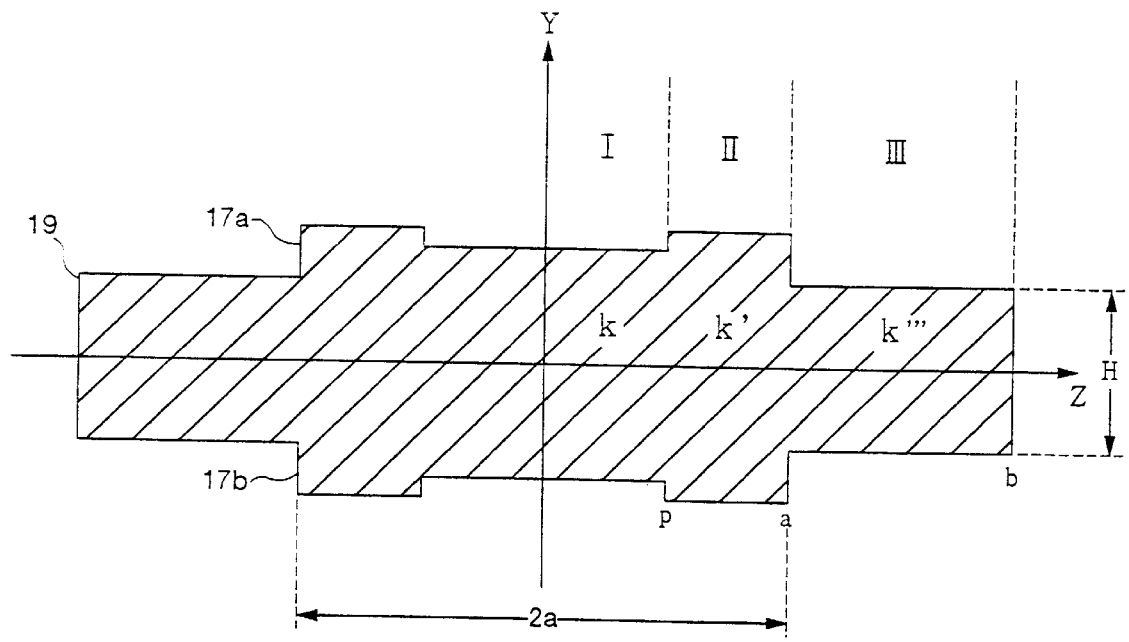
FIG. 2 is a diagram which illustrates an analytical model used to analyze the principle of the present invention.

As seen from the cross-sectional shape shown in FIG. 2, a quartz resonator with a structure in which electrodes 17a and 17b having a length of 2a are disposed on the surfaces of a substrate 19 that has a plate thickness of H is envisioned. The vibrational mode is an SH wave.

The portions of the electrodes 17a and 17b extending from point p to point a have a greater thickness than the other portions of the electrodes, so that the electrodes as a whole have an inverted-mesa shape.

Here, the displacement U is assumed to be as shown below; and it is also assumed that the displacement U is uniformly distributed in the X direction.

$$U = U_i \sin\left(\frac{n\pi}{H}\right) y \exp j\omega t \qquad (1)$$

Here, $U_i$ is a function of Z and is given for the respective regions I, II and III in FIG. 2 by the following equations using the arbitrary constants A, B, C, D and E:

$$U_{i1} = A \cos k_1 Z \qquad (2)$$

$$U_{i2} = B \cos k_2 Z + C \sin k_2 Z \qquad (3)$$

$$U_{i3} = D \cosh k_3 Z + E \sinh k_3 Z \qquad (4)$$

Here, the wave numbers $k_1$, $k_2$ and $k_3$ are the propagation constants for the respective regions and are given by the following equations:

$$k_1 = \left(\frac{n\pi}{H}\right)\sqrt{\left\{\left(\frac{f}{f_1}\right)^2 - 1\right\}} \qquad (5)$$

$$k_2 = \left(\frac{n\pi}{H}\right)\sqrt{\left\{\left(\frac{f}{f_2}\right)^2 - 1\right\}} \qquad (6)$$

$$k_3 = \left(\frac{n\pi}{H}\right)\sqrt{\left\{1 - \left(\frac{f}{f_3}\right)^2\right\}} \qquad (7)$$

wherein, f is the resonance frequency, $f_1$, $f_2$ and $f_3$ are the cut-off frequencies in the respective regions in FIG. 2, t indicates time, and n is the order of the overtone.

If the ratios of the arbitrary constants A, B, C, D and E are determined under the conditions that there is no discontinuity in displacement and stress when Z=p and Z=a in FIG. 2, and that no stress when Z =b, then the following frequency equation is obtained:

$$\left(\frac{k_3}{k_1}\right)\tanh k_3(b - a) = \frac{(P + Q)}{(1 + P \times Q)} \qquad (8)$$

Here, $$P = \tan k_2 (a-p) \qquad (8a)$$

$$Q = \left(\frac{k_1}{k_2}\right)\tan k_1 p \qquad (8b)$$

To perform a numerical calculation on Equation (8) by substituting dimensional data, the following definitions are given.

$$\Delta = \frac{(f_3 - f_1)}{f_1} \qquad (9)$$

$$\psi = \frac{(f - f_1)}{(f_3 - f_1)} \qquad (10)$$

Here, Δ means the mass loading effect of region I with respect to region III, ψ is the normalized resonance resonance frequency, and f is the resonance frequency.

Furthermore, the following quantity is defined as the energy trapping factor:

$$\frac{na\sqrt{\Delta}}{H} \qquad (11)$$

Furthermore, the ratio of mesa-thickness (μ) is defined as follows, and the parameter (p/a) is defined as the ratio of mesa-length.

$$\mu = \frac{(f_1 - f_2)}{(f_3 - f_1)} \qquad (12)$$

Figure 3:
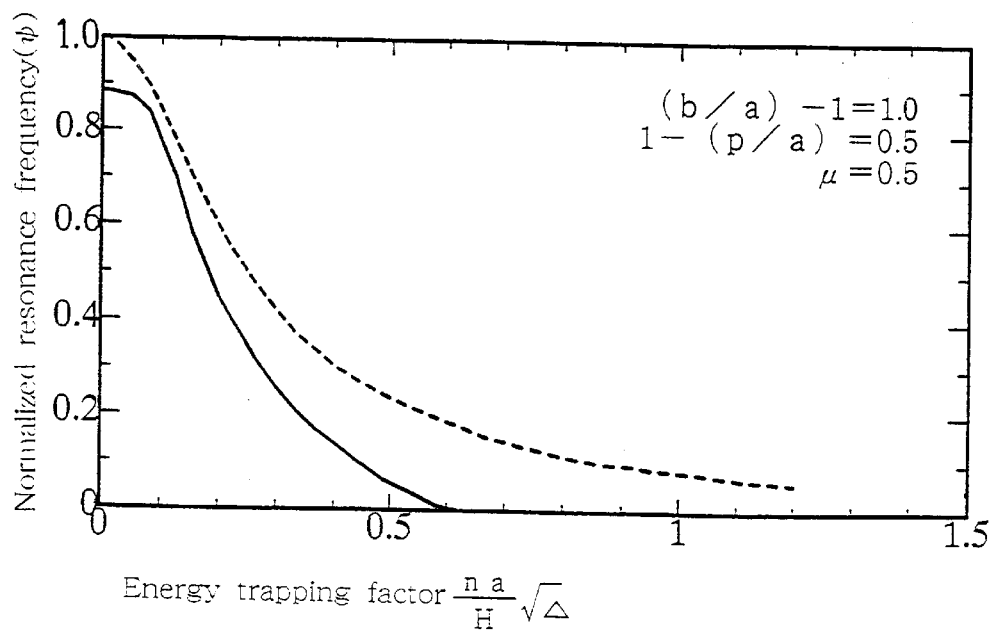
FIG. 3 is a frequency spectrum for the mode $S_0$ which is the lowest symmetry inharmonic mode in AT-cut quartz resonator of present invention and conventional AT-cut quartz resonator.

Next, the frequency spectrum for the mode $S_0$ in a case where the above-described analytical model is used will be described. First, a numerical calculation was performed for the lowest symmetry inharmonic mode $S_1$ using the frequency equation in Equation (8), and the results obtained are shown in FIG. 3. The vertical axis is the normalized resonance frequency ψ, ψ=1 corresponds to the cut-off frequency in region III, and ψ=0 corresponds to the cut-off frequency in region I. Furthermore, the horizontal axis is the energy trapping factor. A special feature of the numerical calculation results shown in the same figure is that ψ is zero when the energy trapping factor is approximately 0.6, as indicated by the solid line. Furthermore, for reference, the numerical calculation results obtained in a case where the thickness of the portion corresponding to region II is made the same as that of the portion corresponding to region I are indicated by a dotted line. This corresponds to a common simple electrode structure which is not an inverted-mesa double electrode structure. As is clear from FIG. 3, ψ never reaches zero.

More specifically, as is clear from the numerical calculation results shown in FIG. 3, it was ascertained that the use of an inverted-mesa shape for the electrode structure results in the existence of a combination of structural parameters which is such that the normalized resonance frequency ψ is equal to zero (i. e., which is such that the resonance frequency f and the cut-off frequency $f_1$ are equal). The significance of this normalized resonance frequency being equal to zero will be discussed in detail below; however, this means that the wave number k1 of the central portions of the electrodes (region I) is zero, i. e., that the displacement $U_{i1}$ of this region is flat. In this case, the capacitance ratio is at a minimum.

Next, whether or not structural parameters which are such that the normalized resonance frequency ψ is always zero exist in a case where an inverted-mesa double electrode structure is used as the electrode structure of the quartz resonator will be examined.

Equation (8) can also be considered as a function of both the normalized resonance frequency in Equation (10) and the energy trapping factor in Equation (11), and the differential coefficient is determined, then it is found as follows:
1) When the ratio of mesa-thickness μ is zero, the larger the value of the abscissa (ψ=0), the smaller is the absolute value of the first derivative. The locus of the function approaches the abscissa asymptotically. The dotted line in FIG. 3 represents this case with an infinite plate for reference.

2) When the ratio of mesa-thickness $\mu$ is positive, then as the value of the abscissa increases, the absolute value of the first derivative does not decrease and is almost constant. Hence, it is natural to assume that the locus will definitely cross the abscissa($\psi$=0).

Under conditions which are such that the normalized resonance frequency $\psi$ is equal to zero, i. e., when the resonance frequency f and the cut-off frequency $f_1$ of region I are equal, the wave number $k_1$ of region I from Equation (5) becomes zero as shown by the equation below. As is also clear from Equation (2), this is a state in which the displacement $U_{i1}$ of region I is flat.

$$k_1=0 \tag{13}$$

Next, we will examine combinations of structural parameters which are such that the displacement of the central portion of the electrode (region I) is flat, i.e., which are such that k1=0. Generally, the conditions under which the central portion of the electrode is flat are given by the following equation:

$$k_3 \tanh k_3(b-a) = k_2 \tan k_2(a-p) \tag{14}$$

Figure 4:
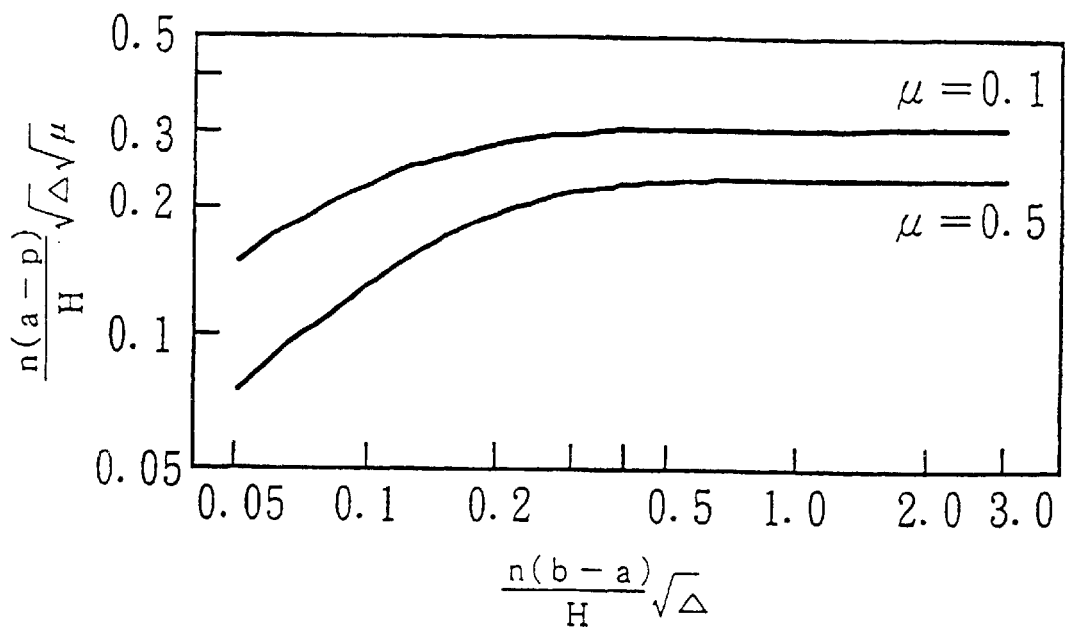
FIG. 4 is a graph which shows the conditions under which region I in the model shown in FIG. 2 is flat.

FIG. 4 shows the results obtained when calculations were performed by substituting Equations (6) and (7) for $k_2$ and $k_3$ in the above-described Equation (14), extracting only the structural parameters necessary for design, and varying the ratio of mesa thickness $\mu$. The horizontal axis indicates a quantity obtained by multiplying the energy trapping factor by the substrate dimension taken with the electrode dimension as a reference {(b-a)/a}, and the vertical axis indicates a quantity obtained by multiplying the energy trapping factor, the ratio of the mesa length (1 -(p/a)) and the ratio of the mesa thickness $\mu$. Furthermore, the values on both the vertical axis and the horizontal axis are abstract numbers, here, the vertical axis is a function of the electrode recess dimension p, and the horizontal axis is a function of the substrate dimension b.

It is seen from FIG. 4 that the value on the vertical axis eventually reaches a fixed value as the value on the horizontal axis increases. This is inferred to mean that as the difference (b-a) between the distance b from the center of the quartz crystal substrate to the end portion of the substrate and the distance a from the center of the quartz crystal substrate to the end portion of the electrode increases, i.e., as region III increases in size, the effects of the substrate end portions on structural parameters such as the dimensions of region I and region II and the thickness, etc., are eliminated. Furthermore, even if the value on the horizontal axis is small, the value on the vertical axis has some magnitude; and it is seen from this that even if the dimensions of region III are small, structural parameters exist which are such that the wave number $k_1$ is equal to zero. In other words, by installing inverted-mesa electrodes, it is possible to obtain a wave number $k_1$ that is equal to zero even if a small-diameter quartz crystal substrate is used.

The setting of structural parameters will be described further.

In a quartz resonator, serious problems occur when an unwanted response of any inharmonic mode appears in the vicinity of the resonance frequency. Here, therefore, the energy trapping factor is chosen so that the lowest-symmetry inharmonic mode $S_1$ is observable.

Figure 5:
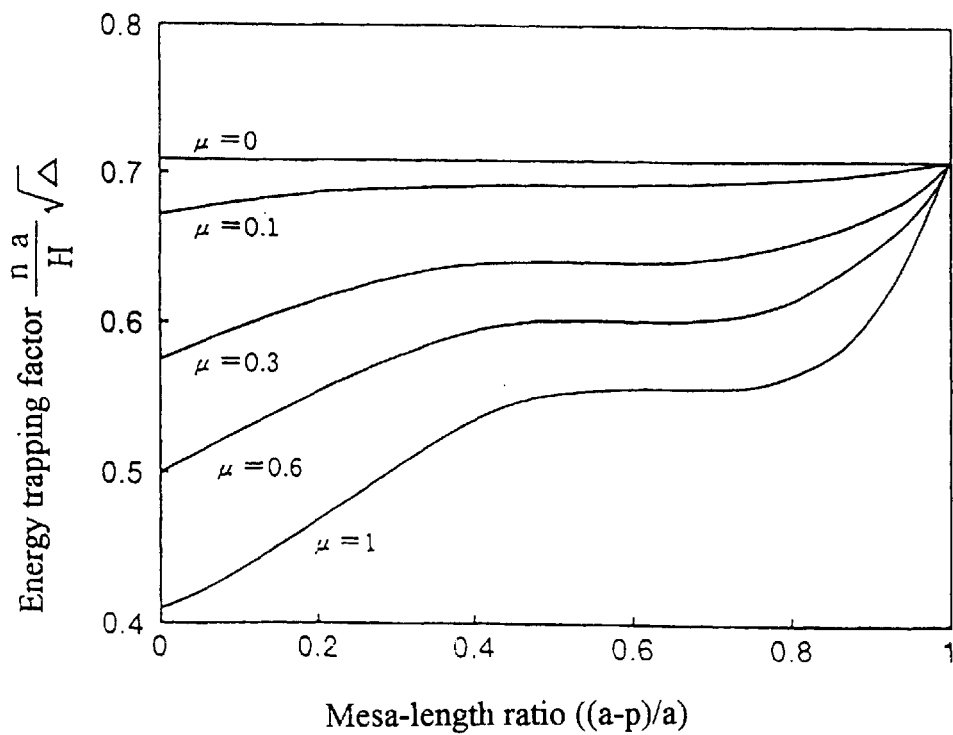
FIG. 5 is a graph which shows the energy trapping factor of the point at which generation of the $S_1$ mode is initiated in the model shown in FIG. 2.

FIG. 5 shows the calculation of the point at which the generation of the lowest-symmetry inharmonic mode $S_1$ is observable in a quartz resonator which has an inverted-mesa electrode shape. Here, the vertical axis is the energy trapping factor, the horizontal axis is the ratio of mesa length (1-(p/a)), and the parameter is the ratio of mesa thickness $\mu$. For example, in the case of the analytical model used for the quartz resonator with an inverted-mesa double electrode structure shown in FIG. 2, if the structural parameters of the quartz resonator are set so that the ratio of mesa length (p/a)=0.5 and the ratio of mesa thickness $\mu$=0.5, then the energy trapping factor at which the $S_1$ mode is generated becomes 0.6 or higher. Meanwhile, as shown by the numerical results in FIG. 3, the energy trapping factor, at which the normalized resonance frequency $\psi$=0, is 0.6. Thus, it can be seen that if the above-described structural parameters and parameters concerning the energy trapping factor are set so that the energy trapping factor at which the $S_1$ mode is generated is larger than the energy trapping factor at which $\psi$=0, then the inharmonic spurious caused by the $S_1$ mode will not be generated.

Figure 6:
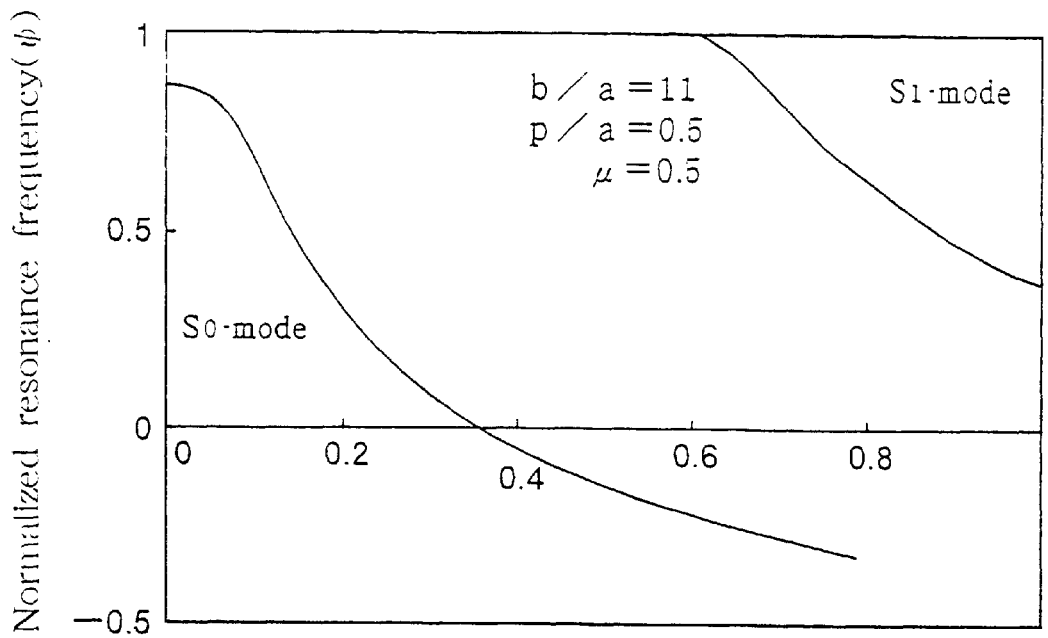
FIG. 6 is a graph which shows the resonance frequency spectrum in the model shown in FIG. 2.

Next, the question of what kind of behavior is shown by a quartz resonator that has an inverted-mesa double electrode structure in a case where the relationship between the energy trapping factor and the normalized resonance frequency is such that $\psi$=0 or less will be examined. In the frequency equation that applies in this case, the propagation constant for region I is an imaginary number; accordingly, it is necessary to perform a numerical analysis by replacing this constant with a real number and then determining a new frequency equation. The results of such a numerical analysis are shown in FIG. 6. In the area of FIG. 6 in which the vertical axis $\psi$ is above zero, the displacement distribution of region I shows a cos shape; and in the area in which the vertical axis $\psi$ is below zero, this distribution shows a cosh shape. Furthermore, as in the case of FIG. 3, $\psi$=1 is the cut-off frequency for region III, and $\psi$=0 is the cut-off frequency for region I. Moreover, in this example of calculation, the ratio of mesa thickness $\mu$ is 0.5, the ratio of mesa length (p/a) is 0.5, and the ratio of the substrate diameter to the electrode diameter (b/a) is 11. In addition, the position where the normalized resonance frequency $\psi$=-0.5 is the position of the cut-off frequency for region II.

It is clearly seen from FIG. 6 that the value varies continuously above and below the horizontal axis where $\psi$=0.

In a case where the displacement distribution of region I shows a cos shape, the displacements of regions I, II and III are respectively given by the following equations:

$$U_{i1} = A \cos k_1 Z \tag{15}$$

$$U_{i2} = A \, \cos k_1 P \frac{(\cos k_2 Z + r \sin k_2 Z)}{(\cos k_2 P + r \sin k_2 P)} \tag{16}$$

$$U_{i3} = A \cos k_1 P \left( \frac{\cos k_2 a + r \sin k_2 a}{\cos k_2 p + r \sin k_2 p} \right) \cdot \left( \frac{\cosh k_3(b-Z)}{\cosh k_3(b-a)} \right) \tag{17}$$

Here, r can be expressed by the following equation using P and Q in Equations (8a) and (8b).

$$r = \frac{(P+Q)}{(1+P \times Q)} \tag{16a}$$

In a case where the displacement distribution of region I shows a cosh shape, the displacements can likewise be determined using Equations (15), (16) and (17) by replacing the propagation constant of region I with a real number.

Figure 7:
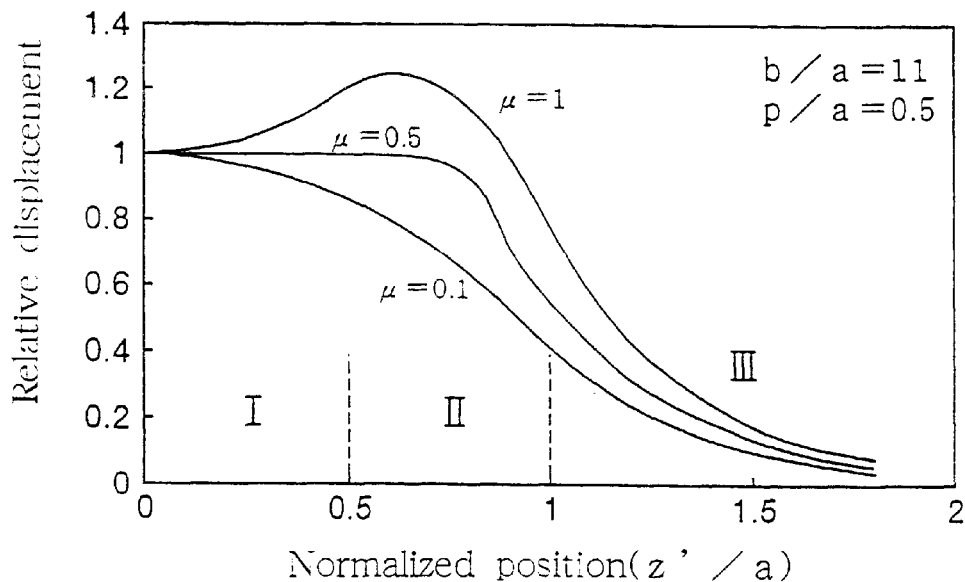
FIG. 7 is a graph which shows an example of calculation of the displacement distribution in the model shown in FIG. 2.

FIG. 7 shows an example of calculation of displacement distributions. As shown in this figure, it was found that the vibrational displacement shape can be greatly varied under conditions which produce no inharmonic spurious by using electrodes that have an inverted-mesa structure and appropriately selecting the energy trapping factor. The displacement distribution in the case of a ratio of mesa thickness $\mu$ is 0.5 is a displacement shape with a flat distribution in the central portion. In cases where the ratio of mesa thickness $\mu$ is less than 0.5, a single-peak distribution is obtained; and in cases where the ratio of mesa thickness $\mu$ is greater than 0.5, a double-peak distribution is obtained.

Next, how the capacitance ratio, which is the ratio of the clamped capacitance $C_0$ in FIG. 8 to the motional capacitance $C_1$ of a series resonance circuit, $C_0/C_1$, varies in a case where the shape of the vibrational displacement is greatly varied by using electrodes with an inverted-mesa structure and appropriately selecting the energy trapping factor will be determined.

First, the calculation of the equivalent inductance L of the resonator is one of the steps in determining the capacitance ratio. In this calculation, it should be assumed that the time average of the electromagnetic energy is equal to that of the kinetic energy, and that the electro-magnetic energy is stored in this equivalent inductance. In this case, the following approximations should be used:

1. As a quartz plate is a low-coupling piezoelectric material, the propagation constant in the thickness direction (y' axis) is given by the product of an odd number and $\pi/2$.

2. The electric field is uniform in the X-Z' plane, and thus has no dependence on either the X or Y' axis.

Under these approximate conditions, the capacitance ratio is given by the following equation:

$$\left(\frac{C_0}{C_1}\right) = \left(\frac{n^2}{k_{26}^2}\right)\left(\frac{\pi^2}{8}\right)\frac{\int\int_{Sw} U^2 \, dx \, dz}{\left(\int\int_{se} dx \, dz\right)^2} \quad (18)$$

Here, $k_{26}$ is the electromechanical coupling factor, n is the order of overtone in the direction of thickness; the displacement consists of the Z-direction and X-direction dependent portions of the displacement in Equation (1); and as a measure of the dimensions, the electrode dimensions in the respective directions are used as a standard. Furthermore, area integration of the denominator is performed only for the electrode surface (Se), and area integration of the numerator is performed for the vibrator as a whole (Sw).

If the mesa shape changes, the displacement shape also changes accordingly, and the capacitance ratio changes with the change in the displacement shape. Independent parameters which regulate the displacement distribution include the ratio of mesa thickness $\mu$ and the ratio of mesa length (p/a). The capacitance ratio of a quartz resonator with an inverted-mesa electrode structure having the structural parameters shown in FIG. 7 can be determined using Equation (18), with the above-described ratio of mesa thickness $\mu$ and ratio of mesa length (p/a) given. Furthermore, if the energy trapping factor at which the inharmonic spurious $S_1$ begins to be generated is selected using FIG. 5, then all of the parameters are determined. More specifically, the ratio of mesa length (p/a) is set at 0.5, and five points, i.e., 0.1, 0.3, 0.5, 1 and 2 are selected for the ratio of mesa thickness $\mu$. The displacements in the case of these parameter settings are expressed by Equations (15), (16) and (17). FIG. 9 shows the results obtained when numerical calculations were performed by substituting these values into the capacitance ratio equation of Equation (18). The horizontal axis is the ratio of mesa thickness $\mu$, and the vertical axis is the capacitance ratio.

In a case where the ratio of mesa thickness $\mu$=0.5, the capacitance ratio takes a minimum value. Here, the electromechanical coupling coefficient of an AT quartz crystal plate is approximately 8.9%. This equals a capacitance ratio of 126, which is determined by the material constants. Since the displacement distribution actually has the form of a sine (sin) function in the direction of thickness, this increases to 156. Furthermore, this is increased by the shape effect. Here, the values in the table shown in FIG. 10 were used to determine the coupling coefficient.

When the ratio of mesa thickness $\mu$ is 0, this corresponds to the case of a conventional simple electrode rather than an inverted-mesa shape. The capacitance ratio in this case is approximately 171, while the capacitance ratio in the case of a ratio of mesa thickness $\mu$ is 0.5 is 169, so that the capacitance ratio is decreased by approximately 2%. Furthermore, when the displacement distribution has a twin peaks shape or when the ratio of mesa thickness $\mu$ exceeds 0.5 or more, then it is seen that the capacitance ratio increases greatly as shown in FIG. 9. Moreover, the use of an inverted-mesa electrode structure results in a decrease of approximately 2% in the capacitance ratio compared to the case of simple electrodes, and this is because the unit length in the X direction is considered to be an infinite length. In actuality, the displacement distribution also varies in this X direction; and therefore, the degree of variation in the capacitance ratio increases, and the effect of the inverted-mesa is enhanced.

Thus, the following results were obtained by way of use of an isotropic one-dimensional analytical method for the energy confinement characteristics of an AT-cut quartz resonator with an inverted-mesa electrode structure:

With the energy trapping factor-at which the lowest-order inharmonic spurious (S1) begins to be generated selected as a condition of analysis, 1. The displacement distribution becomes flat at the central region of the electrode depending on the shape and dimensions of the mesa (i.e., ratio of mesa thickness and ratio of mesa length) and the energy trapping factor. Two displacement distributions with a single peak and twin peaks are also observed in accordance with the choice of parameters.

2. The conditions under which the displacement distribution becomes flat in the central region of the electrode were given.

3. The capacitance ratio becomes minimum where the displacement distribution is flat.

4. The minimum capacitance ratio of an AT-cut quartz resonator with the inverted mesa electrode has a minimum value 169.

It is seen from these facts that the capacitance ratio $\gamma$ of the above-described quartz resonator can be lowered to a value below the limit value (approximately 200), i.e., to a value of 169 in the present embodiment, because of the use of an inverted-mesa shape for the excitation electrodes of the quartz resonator.

Furthermore, in the above Equation (12), the ratio of mesa thickness $\mu$ is expressed as $$\mu = \frac{(f_1 - f_2)}{(f_3 - f_1)}$$

in terms of the cut-off frequencies; here, since the cut-off frequency f can generally be expressed as $$f = \frac{k}{t}$$

(k: constant determined by material, t: plate thickness) as a function of the plate thickness t, it can be said that $\mu$ expresses the thickness ratio.

Next, the method used to manufacture an AT-cut quartz resonator shown in the FIG. 1 will be described.

Figure 11A:
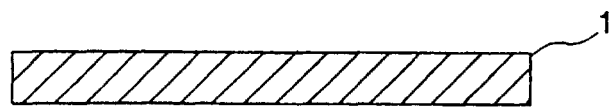
FIG. 11 is a diagram of the manufacturing process used to manufacture an AT-cut quartz resonator shown in FIG. 1(a), (b).
Figure 11B:
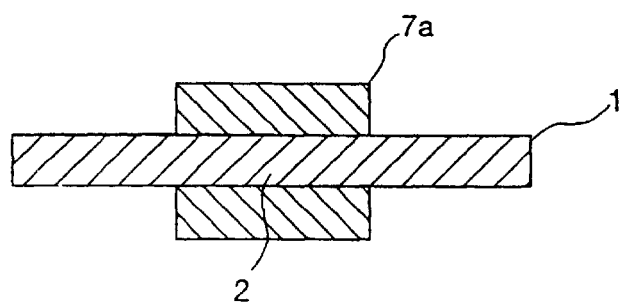
Figure 11C:
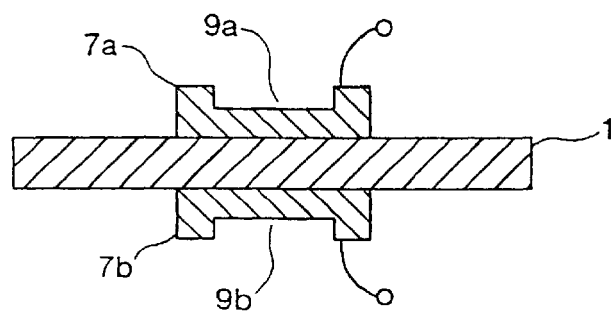

FIG. 11 is a diagram of the manufacturing process for manufacturing an AT-cut quartz resonator shown in FIG. 1. First, as shown in FIG. 11(a), a circular AT-cut quartz crystal substrate 1 is prepared; then, as shown in FIG. 11(b), small-diameter excitation electrodes 7a and 7b are provided to both surfaces of roughly the central portion 2 of the AT-cut quartz crystal substrate 1; and then as shown in FIG. 11(c), the central portions of the electrodes 7a and 7b are removed by a method such as etching, etc. so as to form recesses 9a and 9b, thus producing an inverted-mesa shape.

Figure 12:
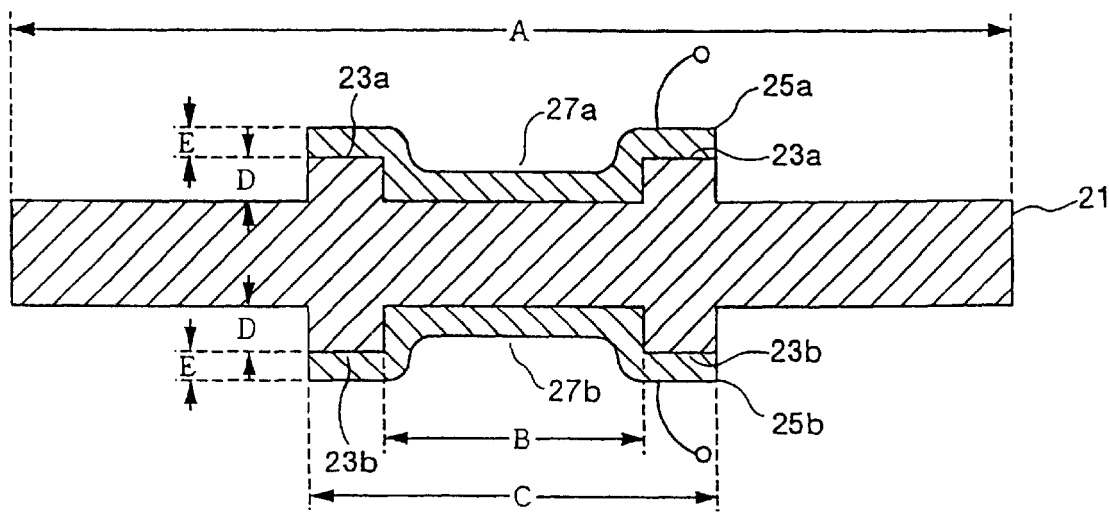
FIG. 12 illustrates the constitution of a second embodiment of the AT-cut quartz resonator of the present invention.

FIG. 12 is a structural diagram which illustrates a second embodiment of the AT-cut quartz resonator of the present invention. As shown in FIG. 12, this second embodiment has a structure in which the portions 23a and 23b of a circular AT-cut quartz crystal substrate 21 that correspond to the peripheral portions of the electrodes located in the central portions on both sides are formed so as to have a greater thickness than the other portions of the substrate 21, and excitation electrodes 25a and 25b with a uniform thickness are formed on top of these portions. Thus, the above-described electrodes 25a and 25 have an inverted-mesa shape with respective recesses 27a and 27b. The function and effect of this second embodiment are the same as those of the above-described first embodiment.

Figure 13A:
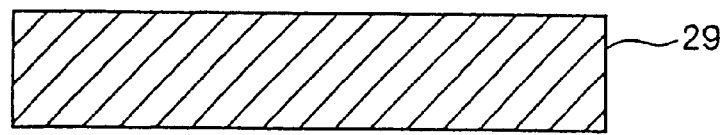
FIG. 13 is a diagram of the manufacturing process used to manufacture the AT-cut quartz resonator shown in FIG. 12.
Figure 13B:
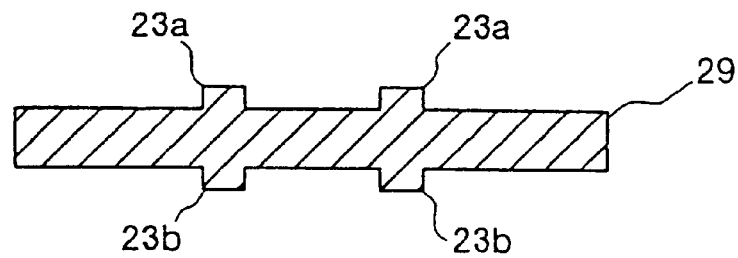
Figure 13C:
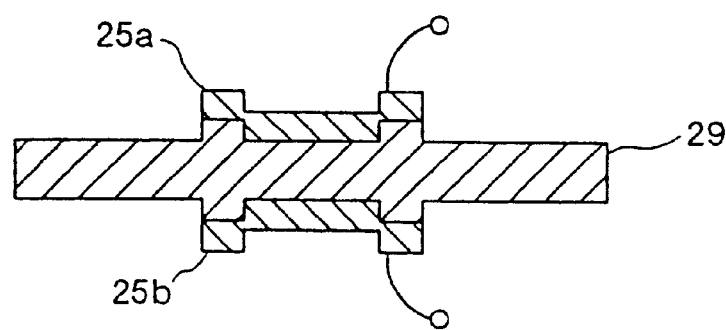

The method used to manufacture the above-described second embodiment will be described with reference to FIG. 13. First, as shown in FIG. 13(a), a circular AT-cut quartz crystal substrate 29 which is slightly on the thick side is prepared. Then, as shown in FIG. 13(b), this quartz crystal substrate 29 is etched so that portions 23a and 23b which correspond to the peripheral portions of the electrodes 25a and 25b are left; and as shown in FIG. 13(c), excitation electrodes 25a and 25b which have a uniform thickness are formed on both surfaces of the central portion of the quartz crystal substrate 29, so that the electrodes 25a and 25b have an inverted-mesa shape.

Next, examples of measurements obtained for the embodiment shown in FIG. 12 will be described.

Here, in the quartz resonator shown in FIG. 12, vacuum-evaporated films of Cr-CrAu-Au (total film thickness 3000Å (angstroms)) with a diameter C of 3.2 mm were caused to adhere to the central portions of an AT-cut circular polished plate 21 that has a diameter A of 7.0 mm, and etching was performed with ammonium fluoride at 60° C., so that portions other than the above-described portions 23a and 23b were removed on both sides by a total amount 2D of 2.3 $\mu$m (D on one side =1.15 $\mu$m). Then, Au films with a thickness E of 2900Å (angstroms) were applied on top of these portions by vacuum evaporation, thus forming excitation electrodes 25a and 25b. When this resonator was placed in an HC-18/U holder and the equivalent constants were measured, the following results were obtained:

Frequency: 10.698760 MHz
Equivalent resistance: 20 Ω
Equivalent series capacitance(mo: 14.85 PF
Parallel capacitance: 2.60 PF
Capacitance ratio: 175

Incidentally, when a sample with ordinary excitation electrodes without an inverted-mesa shape was measured under the above-described conditions, the capacitance ratio was 210.

The quartz resonator with inverted-mesa electrodes provided by the present invention is not limited to those described in the first and second embodiments, and various modifications such as those described below are possible.

Figure 14:
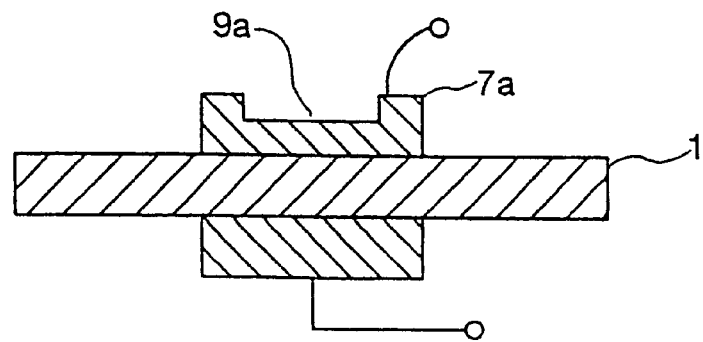
FIG. 14 illustrates a modified example in which only one of the electrodes in the embodiment shown in FIG. 1 is formed with an inverted-mesa shape.
Figure 15:
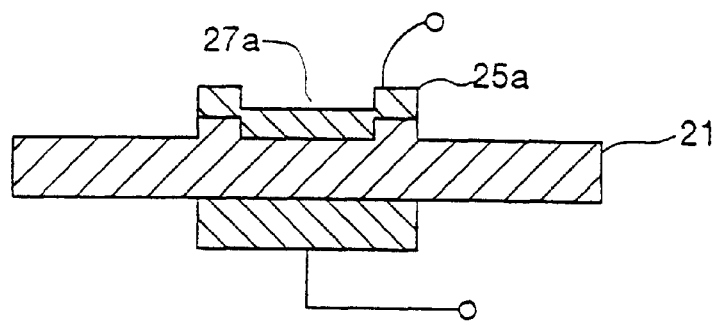
FIG. 15 illustrates a modified example in which only one of the electrodes in the embodiment shown in FIG. 12 is formed with an inverted-mesa shape.

More specifically, FIG. 14 shows an example in which only one electrode 7a has an inverted-mesa shape in the embodiment shown in FIG. 1; and FIG. 15 shows an example in which only the electrode 25a on one side in the embodiment shown in FIG. 12 has an inverted-mesa shape.

Figure 16:
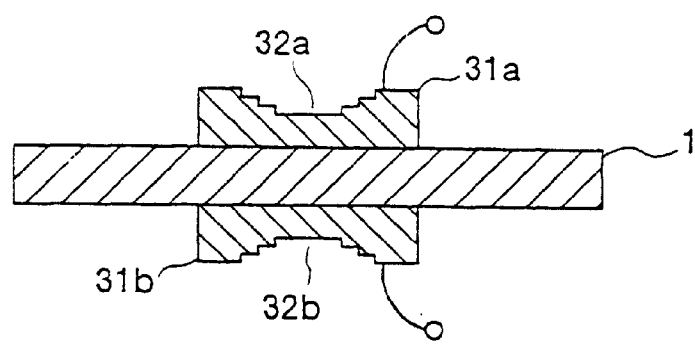
FIG. 16 illustrates a modified example in which the recess of the inverted-mesa excitation electrode is formed in the shape of a stairway.
Figure 17:
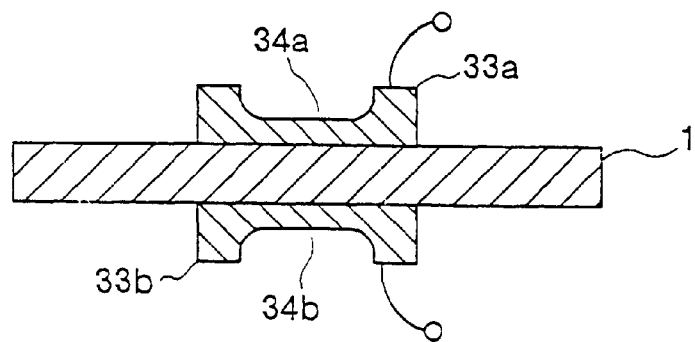
FIG. 17 illustrates a modified example in which the recess of the inverted-mesa excitation electrode is curved in a concave shape.

Moreover, FIG. 16 shows an example in which the recesses 32a and 32b of the inverted-mesa excitation electrodes 31a and 31b have a "stairway" shape, and FIG. 17 shows an example in which the recesses 34a and 35b of the inverted-mesa excitation electrodes 33a and 33b are curved in a concave shape. Furthermore, FIG. 18 shows an example in which the recesses 36a and 36b of the inverted-mesa excitation electrodes 35a and 35b are curved in a convex shape.

Figure 18:
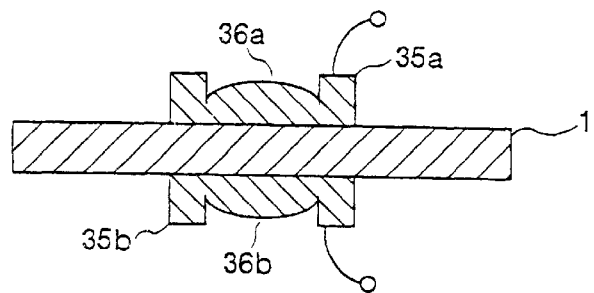
FIG. 18 illustrates a modified example in which the recess of the inverted-mesa excitation electrode is curved in a convex shape.
Figure 19:
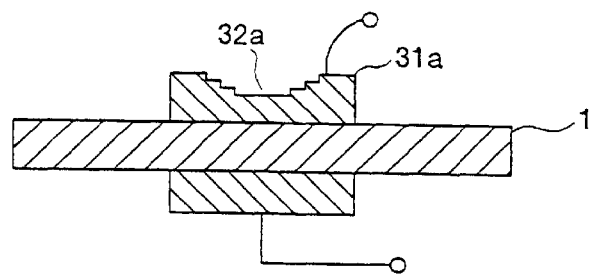
FIG. 19 illustrates a modified example in which only one of the electrodes in the embodiment shown in FIG. 16 is formed with an inverted-mesa shape.
Figure 20:
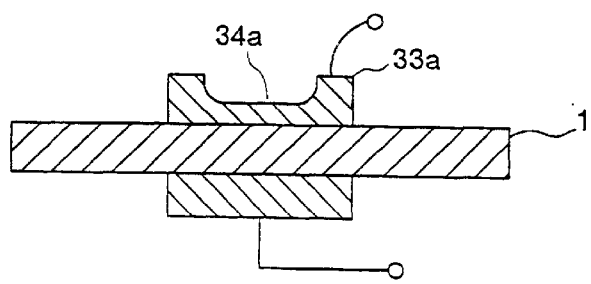
FIG. 20 illustrates a modified example in which only one of the electrodes in the embodiment shown in FIG. 17 is formed with an inverted-mesa shape.
Figure 21:
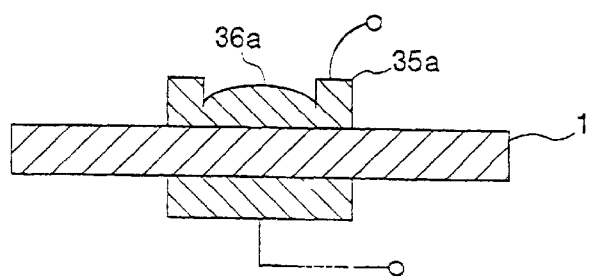
FIG. 21 illustrates a modified example in which only one of the electrodes in the embodiment shown in FIG. 18 is formed with an inverted-mesa shape.
Figure 22A:
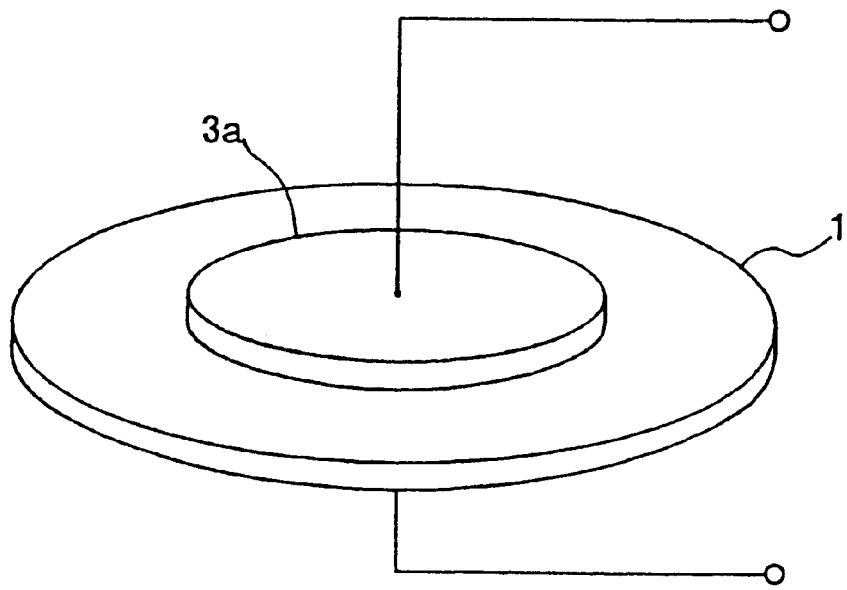
FIG. 22 illustrates a conventional AT-cut quartz resonator in which FIG. 22 (a) is a perspective view thereof, and FIG. 22 (b) is a sectional view taken along the center line of the quartz crystal substrate shown in FIG. 22 (a).
Figure 22B:
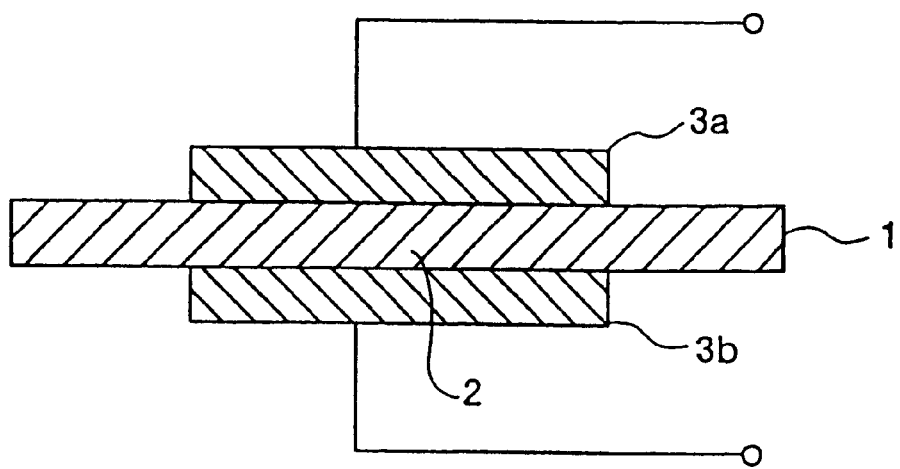

Moreover, FIGS. 19, 20 and 21 show examples in which only one of the electrodes in FIGS. 16, 17 and 18 has an inverted-mesa shape.

In the present invention, since the excitation electrodes of the quartz resonator are formed with an inverted-mesa shape, the capacitance ratio $\gamma$ can be reduced to a value below the limit value. As a result, when this vibrator is used in a VCXO, the frequency variability range of the VCXO can be broadened, and the short-term stability can be improved. Moreover, when a filter is constructed, the band width is broadened, and the impedance is lowered so that vibration is facilitated.

What is claimed is:

1. A piezoelectric vibrator on which excitation electrodes are respectively disposed on a top surface and undersurface of a piezoelectric substrate, and at least one of said excitation electrodes is an inverted-mesa electrode comprising a projecting circular portion and a circular recess provided in said projecting circular portion, and wherein:

a ratio of mesa thickness $\mu$ and a ratio of mesa length are set to satisfy the equation defined as $k_3 \tanh k_3 (b-a) = k_2 \tan k_2 (a-p)$, so that a capacitance ratio $\gamma$ of said piezoelectric vibrator is less than 200, wherein said circular recess in said projecting circular portion of said inverted mesa electrode is defined as region I, said projecting circular portion surrounding said recess is defined as region II, a region outside of said projecting circular portion of said piezoelectric substrate is defined as region III, $f_1$ is a cut-off frequency in said region I, $f_2$ is a cut-off frequency in said region II, $f_3$ is a cut-off frequency in said region III, f is a resonance frequency of said piezoelectric vibrator, $k_2$ is a propagation constant for said region II and obtained by equation:

$$k_2 = \left(\frac{n\pi}{H}\right)\sqrt{\left\{\left(\frac{f}{f_2}\right)^2 - 1\right\}},$$

$k_3$ is a propagation constant for said region III and obtained by equation:

$$k_3 = \left(\frac{n\pi}{H}\right)\sqrt{\left\{1-\left(\frac{f}{f_3}\right)^2\right\}},$$

p is a distance from a center of said circular recess surrounded by said projecting circular portion to an inner edge of said projecting circular portion, a is a distance from said center to an outer edge of said projecting circular portion, b is a distance from said center to an outer edge of said piezoelectric substrate, H is a thickness of said region III, said ratio of mesa thickness $\mu$ is obtained by equation:

$$\mu=(f_1-f_2)/(f_3-f_1), \text{ and}$$

said ratio of mesa length is equal to p/a.

2. A piezoelectric vibrator according to claim 1, characterized in that said ratio of mesa thickness $\mu$ and said ratio of mesa length are set so that said equation defined as $k_3 \tanh k_3 (b-a) = k_2 \tan k_2 (a-p)$ is satisfied, and an energy trapping factor at a time normalized resonance frequency $\psi$ is defined as $\psi=0$ is less than an energy trapping factor at a time inharmonic spurious of said piezoelectric vibrator is generated, wherein a mass loading effect of said region I with respect to said region III is $\Delta$, an energy trapping factor is $$\frac{na\sqrt{\Delta}}{H},$$

and a normalized resonance frequency $\psi$ is obtained by equation:

$$\psi=(f-f_1)/(f_3-f_1).$$

3. A piezoelectric vibrator according to claim 1, characterized in that said ratio of mesa thickness $\mu$ and said ratio of mesa length are set so that said equation defined as $k_3 \tanh k_3 (b-a) = k_2 \tan k_2 (a-p)$ is satisfied, and an energy trapping factor at a time normalized resonance frequency $\psi$ is defined as $\psi=0$ is equal to an energy trapping factor at a time inharmonic spurious of said piezoelectric vibrator is generated, wherein a mass loading effect of said region I with respect to said region III is $\Delta$, an energy trapping factor is $$\frac{na\sqrt{\Delta}}{H},$$

and a normalized resonance frequency $\psi$ is obtained by equation:

$$\psi=(f-f_1)/(f_3-f_1).$$

4. A piezoelectric vibrator according to claim 1, 2 or 3, characterized in that said piezoelectric substrate is an AT-cut quartz crystal substrate.

5. A piezoelectric vibrator according to claim 1, 2 or 3, characterized in that said piezoelectric substrate is of a shape having said projecting circular portion on at least one side thereof, and said excitation electrode is disposed on a surface of said projecting circular portion and on a surface surrounded by said projecting circular portion.

6. An AT-cut quartz crystal substrate piezoelectric vibrator in which a piezoelectric substrate thereof is an inverted-mesa electrode that is of a shape having a projecting circular portion on at least one side thereof, and an excitation electrode is disposed on a surface of said projecting circular portion and on a surface surrounded by said projecting circular portion, and wherein:

a ratio of mesa thickness $\mu$ and a ratio of mesa length are set so that said equation defined as $k_3 \tanh k_3 (b-a) = k_2 \tan k_2 (a-p)$ is satisfied and an energy trapping factor at a time normalized resonance frequency $\psi$ is defined as $\psi=0$ is less than an energy trapping factor at a time inharmonic spurious of said piezoelectric vibrator is generated, so that inharmonic spurious is restrained from generating and a capacitance ratio $\gamma$ of said piezoelectric vibrator is less than 200, wherein said circular recess in said projecting circular portion of said inverted mesa electrode is defined as region I, said projecting circular portion surrounding said recess is defined as region II, a region outside of said projecting circular portion of said piezoelectric substrate is defined as region III, $f_1$ is a cut-off frequency in said region I, $f_2$ is a cut-off frequency in said region II, $f_3$ is a cut-off frequency in said region III, f is a resonance frequency of said quartz crystal substrate, $k_2$ is a propagation constant for said region II and obtained by equation:

$$k_2 = \left(\frac{n\pi}{H}\right)\sqrt{\left\{\left(\frac{f}{f_2}\right)^2-1\right\}},$$

$k_3$ is a propagation constant for said region III and obtained by equation:

$$k_3 = \left(\frac{n\pi}{H}\right)\sqrt{\left\{1-\left(\frac{f}{f_3}\right)^2\right\}},$$

p is a distance from a center of said circular recess surrounded by said projecting circular portion to an inner edge of said projecting circular portion, a is a distance from said center to an outer edge of said projecting circular portion, b is a distance from said center to an outer edge of said piezoelectric substrate, H is a thickness of said region III, said ratio of mesa thickness $\mu$ is obtained by equation:

$$\mu=(f_1-f_2)/(f_3-f),$$

said ratio of mesa length is equal to p/a, a mass loading effect of said region I with respect to said region III is $\Delta$, an energy trapping factor is $$\frac{na\sqrt{\Delta}}{H},$$

and a normalized resonance frequency $\psi$ is obtained by equation:

$$\psi=(f-f_1)/(f_3-f_1).$$

7. An AT-cut quartz crystal substrate piezoelectric vibrator in which a piezoelectric substrate thereof is an inverted-mesa electrode that is of a shape having a projecting circular portion on at least one side thereof, and an excitation electrode is disposed on a surface of said projecting circular portion and on a surface surrounded by said projecting circular portion, and wherein:

a ratio of mesa thickness $\mu$ and a ratio of mesa length are set so that said equation defined as $k_3 \tanh k_3 (b-a) k_2 \tan k_2 (a-p)$ is satisfied and an energy trapping factor at a time normalized resonance frequency $\psi$ is defined as $\psi=0$ is equal to an energy trapping factor at a time inharmonic spurious of said piezoelectric vibrator is generated, so that inharmonic spurious is restrained from generating and a capacitance ratio $\gamma$ of said piezoelectric vibrator is less than 200, wherein said circular recess in said projecting circular portion of said inverted mesa electrode is defined as region I, said projecting circular portion surrounding said recess is defined as region II, a region outside of said projecting circular portion of said piezoelectric substrate is defined as region III, $f_1$ is a cut-off frequency in said region I, $f_2$ is a cut-off frequency in said region II, $f_3$ is a cut-off frequency in said region III, f is a resonance frequency of said quartz crystal substrate, $k_2$ is a propagation constant for said region II and obtained by equation:

$$k_2 = \left(\frac{n\pi}{H}\right)\sqrt{\left\{\left(\frac{f}{f_2}\right)^2 - 1\right\}},$$

$k_3$ is a propagation constant for said region III and obtained by equation:

$$k_3 = \left(\frac{n\pi}{H}\right)\sqrt{\left\{1 - \left(\frac{f}{f_3}\right)^2\right\}},$$

p is a distance from a center of said circular recess surrounded by said projecting circular portion to an inner edge of said projecting circular portion, a is a distance from said center to an outer edge of said projecting circular portion;

b is a distance from said center to an outer edge of said piezoelectric substrate, H is a thickness of said region III, said ratio of mesa thickness $\mu$ is obtained by equation:

$$\mu=(f_1-f_2)/(f_3-f_1),$$

said ratio of mesa length is equal to p/a, a mass loading effect of said region I with respect to said region III is $\Delta$, an energy trapping factor is $$\frac{na\sqrt{\Delta}}{H},$$

and a normalized resonance frequency $\psi$ is obtained by equation:

$$\psi=(f-f_1)/(f_3-f_1).$$

8. A piezoelectric vibrator according to claim 1, 2, 3, 6 or 7, characterized in that said projecting circular portion is formed in a stairway shape.

9. A piezoelectric vibrator according to claim 1, 2, 3, 6 or 7, characterized in that said region I of said piezoelectric substrate is curved in a concave shape.

10. A piezoelectric vibrator according to claim 1, 2, 3, 6 or 7, characterized in that said region I of said piezoelectric substrate is curved in a convex shape.

* * * * *